United States Patent

DeYoung et al.

(10) Patent No.: US 6,669,785 B2
(45) Date of Patent: Dec. 30, 2003

(54) METHODS AND COMPOSITIONS FOR ETCH CLEANING MICROELECTRONIC SUBSTRATES IN CARBON DIOXIDE

(75) Inventors: James P. DeYoung, Durham, NC (US); Stephen M. Gross, Chapel Hill, NC (US); Mark I. Wagner, Raleigh, NC (US); James B. McClain, Raleigh, NC (US)

(73) Assignee: Micell Technologies, Inc., Raleigh, NC (US)

( * ) Notice: Subject to any disclaimer, the term of this patent is extended or adjusted under 35 U.S.C. 154(b) by 0 days.

(21) Appl. No.: 10/146,617

(22) Filed: May 15, 2002

(65) Prior Publication Data

US 2003/0216269 A1 Nov. 20, 2003

(51) Int. Cl.$^7$ ................................................ C23G 1/02
(52) U.S. Cl. ............................... 134/3; 134/2; 134/25.4; 134/26; 134/28; 134/29; 134/34; 134/36; 134/41; 134/42
(58) Field of Search ............................. 134/2, 3, 25.4, 134/26, 28, 29, 34, 36, 41, 42

(56) References Cited

U.S. PATENT DOCUMENTS

| 5,868,862 | A | | 2/1999 | Douglas et al. | |
| 5,908,510 | A | | 6/1999 | McCullough et al. | |
| 5,976,264 | A | | 11/1999 | McCullough et al. | |
| 6,149,828 | A | | 11/2000 | Vaartstra | |
| 6,500,605 | B1 | * | 12/2002 | Mullee et al. | 430/329 |
| 2003/0051741 | A1 | * | 3/2003 | DeSimone et al. | 134/21 |

FOREIGN PATENT DOCUMENTS

WO  WO 02/15251  2/2002

OTHER PUBLICATIONS

International Search Report for International Patent Application Ser. No. PCT/US03/14735 dated Jul. 23, 2003.

* cited by examiner

*Primary Examiner*—Sharidan Carrillo
(74) *Attorney, Agent, or Firm*—Myers Bigel Sibley & Sajovec

(57) ABSTRACT

A method of cleaning a microelectronic substrate is carried out by providing a cleaning fluid, the cleaning fluid comprising an adduct of hydrogen fluoride with a Lewis base in a carbon dioxide solvent; and then cleaning the substrate by contacting the substrate to the cleaning fluid for a time sufficient to clean the substrate.

8 Claims, No Drawings

METHODS AND COMPOSITIONS FOR ETCH CLEANING MICROELECTRONIC SUBSTRATES IN CARBON DIOXIDE

FIELD OF THE INVENTION

The present invention concerns methods for cleaning microelectronic substrates, and particularly concerns methods for removal of photoresist layers, anti-reflective layers, etch residues, ash residues, and metallic residues from microelectronic substrates during the manufacturing of microelectronics, MEM's, and optoelectronic devices.

BACKGROUND OF THE INVENTION

Approximately one in four processing steps in manufacturing integrated circuits is a cleaning step. Manufacturing steps associated with the formation of lines and interconnects, often referred to as 'back end of the line', BEOL, have evolved significantly as feature sizes have continued to decrease. The advent of new low k materials and copper interconnect technologies enable the evolution of smaller feature sizes but require new and better cleaning processes. In some cases traditional cleaning processes are either ineffective or damaging toward the new materials. Hydrogen fluoride, typically aqueous, has been used at varying concentrations for traditional aqueous-based and solvent-based cleaning and stripping processes. Carbon dioxide has been described for use in cleaning integrated circuits as have mixtures of carbon dioxide and aqueous hydrogen fluoride or buffered aqueous hydrogen fluoride.

Literature of background interest includes U.S. Pat. Nos. 5,908,510, 5,976,264, 5,868,862, 6,149,828, and PCT Patent Application WO 02/15251.

A problem with aqueous cleaning techniques is that the surface tension of water makes it difficult to deliver chemistry to small feature sizes. Indeed, if water can get into to very small features, it is difficult to subsequently remove. Some new materials incorporate smaller features where aqueous cleaning systems are incompatible. For such materials, $CO_2$ cleaning is advantageous: the lack of surface tension facilitates penetration into and rinsing of small features, the swellability of some materials in $CO_2$ facilitates delivery of chemistry at interfaces, the density "tunability" of $CO_2$ gives a wide window of process variables, and $CO_2$ is generally considered to be environmentally benign. Unfortunately, there is currently no good way to deliver HF in $CO_2$.

SUMMARY OF THE INVENTION

A first aspect of the present invention is a method of cleaning a microelectronic substrate, comprising: providing a cleaning fluid, the cleaning fluid comprising an adduct of hydrogen fluoride with a Lewis base in a carbon dioxide solvent; and then cleaning the substrate by contacting the substrate to the cleaning fluid for a time sufficient to clean the substrate.

In some embodiments, the adduct is formed in situ, such as by adding anhydrous hydrogen fluoride to a carbon dioxide fluid containing the Lewis base (particularly an amine), so that the adduct of the hydrogen fluoride and the Lewis base is formed in situ in the carbon dioxide.

In some embodiments, the Lewis base has a pKa of at least 5. In some embodiments, the Lewis base is an amine, such as is pyridine, poly(vinylpyridine), or triethyl amine.

In some embodiments, the cleaning fluid is nonaqueous. The carbon dioxide may be liquid or supercritical carbon dioxide. The cleaning step may be preceded by, followed by, or both preceded and followed by the step of cleaning or rinsing the substrate with a rinse fluid, the rinse fluid comprising, consisting essentially of or consisting of liquid or supercritical carbon dioxide. In some embodiments, the rinse fluid may further comprise one or more cosolvents.

In some embodiments, the substrate has a photoresist layer formed thereon, and the cleaning step removes photoresist from the substrate.

In some embodiments, the substrate has etch residue deposited thereon, and the cleaning step removes etch residue from the substrate.

some embodiments, the substrate has ash residue deposited thereon, and the cleaning step removes ash residue from the substrate.

In some embodiments, the substrate has metal residue deposited thereon, and the cleaning step removes metal residue from the substrate.

In some embodiments, the substrate comprises a dielectric layer such as a low k dielectric material containing an oxide, photoresist or etch residue formed thereon, and the cleaning step partially removes the oxide, and completely removes the photoresist or etch residue from the low k dielectric material.

In some embodiments, the substrate comprises or includes an inorganic oxide containing surface carrying an adhered processing residue, and the adduct chemically etches the inorganic oxide containing surface to facilitate the removal of the adhered processing residue.

In some embodiments, the substrate is a microelectromechanical device (MEMS), which may have a plurality (e.g., two or more) mechanically interacting elements, and the cleaning step is carried out to clean the device, reduce stiction between mechanically interacting elements of the device, free a frozen or stuck element of the device, etc.

In a particularly preferred embodiment of the foregoing, the adduct is [pyridinium poly(hydrogen fluoride)], also known as hydrogen fluoride pyridine adduct or triethylamine trihydrofluoride.

A second aspect of the present invention is a fluid composition useful for cleaning a microelectronic substrate, comprising: from 0.0001, 0.0005 or to 5, 10 or 20 percent by weight of an adduct of hydrogen fluoride and a Lewis base; and from 40 or 50 to 99.999 percent by weight of liquid or supercritical carbon dioxide. The composition is aqueous in some embodiments and nonaqueous in other embodiments. The Lewis base may be as described above. The composition may further comprise from 0.001 or 0.1 percent to 30 or 40 percent by weight of a cosolvent (including combinations of cosolvents), and/or from 0.001 to 1, 3 or 5 percent by weight of a surfactant. Typically the fluid has a density of from 0.15 g/cc to 1.1 g/cc and a temperature of from 0 to 80 degrees C.

A specific embodiment of the foregoing methods may be carried out by:

(a) providing-a first (optionally but preferably nonaqueous) cleaning fluid, the first cleaning fluid comprising a single phase solution of an amine and a semi-polar to polar cosolvent in carbon dioxide;

(b) providing a second cleaning fluid, the second cleaning fluid comprising an adduct of hydrogen fluoride with a Lewis base in carbon dioxide;

(c) cleaning the substrate by contacting the substrate to the second cleaning fluid for a time sufficient to clean the substrate; and (d) cleaning the substrate before, after, or both before and after the cleaning step (c) by contacting the substrate to the first cleaning fluid for a time sufficient to facilitate the cleaning of the substrate.

The amine may, for example, be morpholine, and the polar cosolvent may, for example, be a C1–C4 alcohol. The second cleaning fluid including the Lewis base may be as described above, and the substrates to be cleaned may be as described above.

Without wishing to be bound to any particular theory of the instant invention, it will be noted that in some embodiments the HF may clean by etching the material to be cleaned. Relative to the conventional practice of etching dielectric materials and the scope of what is the present invention, the word "etching" may be confusing. Dielectric layers are typically patterned during manufacturing by anisotropic etching, usually with reactive ions in a plasma or gas phase but liquid compositions have been disclosed. Typically, a patterned resist serves as a mask for areas of the dielectric that are not etched away. Conventionally, the resists and etch residues are then removed in either an ash and wet clean process, or by liquid stripping and cleaning processes. It is the conventional strip and clean step that is being replaced with the instant invention—not what is conventionally referred to as etching. Further, the HF compositions described herein are also useful for cleaning where oxides are not the primary dielectric composition (organic dielectrics for example, or with steps involving metal layers.) For these reasons, the minimal etching of oxide layers is considered one possible mechanism that effects the cleaning described herein, but is not the only mechanism by which the cleaning described herein may be carried out.

DETAILED DESCRIPTION OF THE PREFERRED EMBODIMENTS

The present invention will be carried out on a variety of substrates including but not limited to semiconductors such as gallium arsenide, silicon wafers containing process residue, transient and non-transient layers applied in the manufacturing of semiconductor devices such as integrated circuits, sapphire wafers, microelectromechanical devices (MEMs), and optoelectronic devices.

Any Lewis base that forms an adduct with hydrogen fluoride to thereby stabilize or solubilize the hydrogen fluoride in the carbon dioxide etch solution may be used to carry out the present invention. Examples include both amine and non-amine Lewis bases. Examples of suitable amine Lewis bases include, but are not limited to, pyridine, poly(vinylpyridine), melamine, $R_3N$ wherein R is ethyl, propyl, butyl, pentyl, etc., triethanolamine, (R) imido fluoride wherein R is phenyl, alkyl, haloalkyl, etc., 1,3 dimethyl-2-imidazolidinone, hexamethylenetetramine, 1,8-bis(dimethylamino)napthalene, and picoline (See, e.g., Olah, G. A.; Nojima, M.; Kerekes, I. Synthesis 1973, 779, 780). Non-amine Lewis bases that may be used to carry out the present invention include, but are not limited to, trialkyl phosphines, triaryl phosphines, thiophene, dialkyl sulfides, diaryl sulfides, ethers, etc. Note that the Lewis base may be a base-functionalized polymer, such as a polythiophene, a polyether, a crown ether, a polyamine, etc.

The terms "low k dielectric material" and "low dielectric constant dielectric material", as used herein, are intended to refer to a dielectric material having a dielectric constant below about 3.5, and preferably about 2.5 or less. Typically the terms "low k dielectric material" or "low dielectric constant dielectric material", as used herein, refer to a dielectric material having a dielectric constant of from as low as about 1.4 to about 3.5. The current invention may also be useful in cleaning substrates containing dielectric layers where the k value is between 4.5 and 3.5. The film of low k dielectric material formed on the substrate usually will range in thickness from about 100 or 200 nanometer (nm) to about 1,000 nm or 2,000 nm, and preferably from about 400 nm to about 800 nm, although either thinner or thicker films may be used in the process of the invention if desired. Usually the film of low k dielectric material is formed over an underlying integrated circuit structure of which it becomes a part. The film of low k dielectric material may, for example, comprise a low k carbon-doped silicon oxide dielectric material which is formed by reacting a carbon-substituted silane with a mild oxidizing agent such as hydrogen peroxide to form a film of carbon-doped low k silicon oxide dielectric material. The invention may also be useful in the treatment of other types of low k dielectric material such as hydrogen-doped or fluorinated silicon oxide dielectric films, or potentially fully organic low k films.

1. Substrates Coatings and Residues.

The transient layer may be a layer of photoresist, or an anti-reflective coating layer. The process residue may include inorganic or organic contaminants such as polymers based on stryenic, acrylic, novolac, cyclic olefinic maleic anhydride resins; etch and ash residue based on ions of fluorine, chlorine, bromine or iodine, and oxygen; metallic impurities containing tantalum, titanium, copper, aluminum or tungsten; and slurry residue containing silica or alumina abrasives with other common slurry additives such as oxidizers, buffers, stabilizers, surfactants, passivating agents, complexing agents, corrosion inhibitors or other agents.

Transient layers such as photochemically active resists are typically applied by spin coating from solvent. The resist typically comprises a polymeric material, and may be a positive-acting resist or a negative-acting resist. The resist may be patterned or unpatterned, developed or undeveloped at the time the $CO_2$ treating process is carried out. Preferably in the application of the invention for stripping photoresist and removing etch residue, the resist is patterned having served the purpose of masking portions of the wafer surface for the etch step.

Any suitable resist composition or anti-reflective coating can be used in conjunction with the present invention, including but not limited to those described in U.S. Pat. Nos. 6,042,997; 5,866,304; 5,492,793; 5,443,690; 5,071,730; 4,980,264; and 4,491,628. Conventional etching, ashing, and chemical and mechanical polishing processes may also be used in conjunction with the current invention. Applicants specifically intend that the disclosures of all United States patent references that are cited herein be incorporated herein by reference in their entirety.

2. Carbon Dioxide Compositions.

Carbon-dioxide compositions used to carry out the present invention typically comprise:

(a) carbon dioxide to balance, typically at least 40, 50 60, or 70 percent;

(b) optionally, where desired, from 0, 0.01, 0.1, 0.5, 1 or 2 percent to 5 or 10 percent or more of surfactant;

(c) optionally, where desired, from 0, 0.01, 0.1, 1 or 2 to 30, 40 or 50 percent or more of an organic co-solvent;

(d) optionally, and in some embodiments less preferably, from 0.01, or 0.1 to 2, 5 or 10 percent water (and in other embodiments 0 percent water); and (e) from 0.0001% or 0.0005% to 4% or 5% of a hydrogen fluoride Lewis base adduct Percentages herein are expressed as percentages by weight unless otherwise indicated.

The composition may be provided as a liquid or supercritical fluid, including cryogenic liquids. Liquid and supercritical carbon dioxide are herein together referred to as "densified" carbon dioxide in accordance with established usage.

The organic co-solvent may be one compound or a mixture of two or more ingredients. The organic co-solvent may be or comprise an alcohol (including diols, triols, etc.), ether, amine, ketone, carbonate, or alkanes, or hydrocarbon (aliphatic or aromatic) The organic co-solvent may be a mixture of compounds, such as mixtures of alkanes as given above, or mixtures of one or more alkanes in combination with additional compounds such as one or more alcohols as described above. (e.g., from 0 or 0.1 to 5% of a C1 to C15 alcohol (including diols, triols, etc.)). Any surfactant can be used to carry out the present invention, including both surfactants that contain a $CO_2$-philic group (such as described in PCT Application WO96/27704 or U.S. Pat. No. 5,783,082) linked to a $CO_2$-phobic group (e.g., a lipophilic group) and surfactants that do not contain a $CO_2$-philic group (i.e., surfactants that comprise a hydrophilic group linked to a hydrophobic (typically lipophilic) group). A single surfactant may be used, or a combination of surfactants may be used. Numerous surfactants are known to those skilled in the art. See, e.g., McCutcheon's Volume 1: Emulsifiers & Detergents (1995 North American Edition) (MC Publishing Co., 175 Rock Road, Glen Rock, N.J. 07452). Examples of the major surfactant types that can be used to carry out the present invention include the: alcohols, alkanolamides, alkanolamines, alkylaryl sulfonates, alkylaryl sulfonic acids, alkylbenzenes, amine acetates, amine oxides, amines, sulfonated amines and amides, betaine derivatives, block polymers, carboxylated alcohol or alkylphenol ethoxylates, carboxylic acids and fatty acids, a diphenyl sulfonate derivatives, ethoxylated alcohols, ethoxylated alkylphenols, ethoxylated amines and/or amides, ethoxylated fatty acids, ethoxylated fatty esters and oils, fatty esters, fluorocarbon-based surfactants, glycerol esters, glycol esters, hetocyclic-type products, imidazolines and imidazoline derivatives, isethionates, lanolin-based derivatives, lecithin and lecithin derivatives, lignin and lignin derivatives, maleic or succinic anhydrides, methyl esters, monoglycerides and derivatives, olefin sulfonates, phosphate esters, phosphorous organic derivatives, polyethylene glycols, polymeric (polysaccharides, acrylic acid, and acrylamide) surfactants, propoxylated and ethoxylated fatty acids alcohols or alkyl phenols, protein-based surfactants, quaternary surfactants, sarcosine derivatives, silicone-based surfactants, soaps, sorbitan derivatives, sucrose and glucose esters and derivatives, sulfates and sulfonates of oils and fatty acids, sulfates and sulfonates ethoxylated alkylphenols, sulfates of alcohols, sulfates of ethoxylated alcohols, sulfates of fatty esters, sulfonates of benzene, cumene, toluene and xylene, sulfonates of condensed naphthalenes, sulfonates of dodecyl and tridecylbenzenes, sulfonates of naphthalene and alkyl naphthalene, sulfonates of petroleum, sulfosuccinamates, sulfosuccinates and derivatives, taurates, thio and mercapto derivatives, tridecyl and dodecyl benzene sulfonic acids, etc.

The present invention is explained in greater detail in the following non-limiting Examples.

EXAMPLE 1

Photoresist Removal

Photoresist is used as a mask to pattern a dielectric layer on a substrate using reactive ion etching. The photoresist used for this process is removed in the following steps. The substrate is loaded into a pressure vessel and supercritical $CO_2$ is added to the vessel at 3,000 psi and 45° C. As the supercritical $CO_2$ circulates through the vessel, a mixture consisting of pyridine and HF is added. The mixture composition by weight is 99:1, and the total concentration of adjunct mixture added is 5% of the overall weight. The solvent mixture is circulated for 1 minute. This cleaning step precedes a pure supercritical $CO_2$ rinse which lasts for 30 seconds. The system is vented and the substrate removed.

EXAMPLE 2

Plasma Ashing followed by Photoresist Strip

The first step of bulk organic removal/photoresist strip is done by plasma ashing. Ashing is typically stopped just short of the dielectric surface. Subsequent polymeric photoresist and ash residue is removed from a test pattern in the following process steps. The substrate is loaded into the pressure vessel. Supercritical $CO_2$ is added to the vessel at 2,500 psi and 55° C. As the supercritical $CO_2$ circulates through the vessel, a co-solvent mixture composed of dibutylamine and methanol and a surfactant containing both a $CO_2$-philic and $CO_2$-phobic portion such as the double tailed phosphate fluorosurfactant Sodium (Bis 1,1,2,2-tetrahydroperfluoro octyl) phosphate. is added to the vessel with the flow distributed evenly over the surface of the substrate. The mixture composition by weight is 85:14:1, and the total concentration of adjunct added is 3% of the overall weight. The solvent mixture circulates through the vessel for 30 seconds. A supercritical $CO_2$ rinse then removes the solvent mixture from the vessel. A mixture consisting of pyridine and HF is then added. The mixture composition by weight is 99.5:0.5, and the total concentration of adjunct added is 8% of the overall weight. The second solvent mixture contacts the substrate for 10 seconds, and is then followed by a pure supercritical $CO_2$ rinse. The system is vented and the substrate removed.

EXAMPLE 3

Removal of Photoresist and Residue from a Via

Polymeric photoresist and resist residue is removed from a via post reactive ion etch (RIE) of a test structure using the following process steps. The substrate is placed in the pressure vessel. Morpholine and methanol in supercritical $CO_2$ is added to the vessel at 3,000 psi at 75° C. The mixture composition by weight is 20:80, and the total concentration of the adjunct added is 2%. The fluid mixture circulates through the vessel for 2 minutes. A second cleaning solution consisting of pyridine, HF and a high purity surfactant displaces the first cleaning solution. The mixture composition by weight is 93:6:1, and the total concentration of the adjunct added is 1% of the overall weight. The second mixture contacts the substrate for 1 minute. Finally, a pure supercritical $CO_2$ rinse is completed by the addition of pure $CO_2$ to the vessel. The system is depressurized and the substrate removed.

EXAMPLE 4

Removal of Photoresist and Residue From a Trench

Polymeric photoresist and etch residue is removed from a trench post RIE of a test structure using the following process steps. The substrate is loaded into the pressure vessel and supercritical $CO_2$ is added to the vessel to 2,400 psi at 60° C. As the supercritical $CO_2$ circulates through the vessel, a mixture consisting of an amine (isopropylamine) and methanol is added. The mixture composition by weight is 90:10, and the total concentration of adjunct added is 7% of the overall weight. The solvent mixture circulates through the vessel for 30 seconds then a second cleaning solution consisting of pyridine and HF is added after the first mixture is displaced by a pure $CO_2$ rinse. The mixture composition by weight is 99.99:0.01, and the total concentration of adjunct added is 5% of the overall weight. The mixture circulates through the vessel for 20 seconds and then a third cleaning solution consisting of 2% pyridine is charged into the vessel, evenly distributed, and directed to the surface of the wafer. The system is then rinsed with pure supercritical $CO_2$ for a period of time sufficient to remove all adjunct chemistry and the system is depressurized.

EXAMPLE 5

Removal of Residue From a Dual Damascene Structure

Etch and metallic residue is removed from a post-barrier breakthrough, dual damascene structure during a back end of the line cleaning step using the following process. The substrate is loaded into the vessel and supercritical $CO_2$ was added to the vessel to a pressure of 2,700 psi at 70° C. As the supercritical $CO_2$ circulates through the vessel, a mixture consisting of pyridine and HF is added. The mixture composition by weight is 95:5, and the total concentration of adjunct added is 1% of the overall weight. The solvent mixture is circulated for 20 seconds. A supercritical $CO_2$ rinse removes the solvent mixture from the vessel before a second cleaning solution consisting of an aqueous solution of a copper chelating complex and a corrosion inhibitor in a supercritical $CO_2$ emulsion containing a high purity $CO_2$-philic-b-hydrophilic surfactant such as poly(1,1,-dihydroperfluoro octyl acrylate)-b-poly (ethylene oxide) is charged into the vessel. The emulsion is in contact with the substrate for 1 minute. The system is then rinsed with 95% supercritical $CO_2$/5% isopropanol followed by pure $CO_2$ and the system is depressurized.

EXAMPLE 6

Residue Removal From a Via of a Dual Damascene Structure

Polymeric photoresist and etch residue is removed from a via post reactive ion etching (RIE) of a dual damascene structure using the following process steps. The substrate is placed in the pressure vessel and an amine (hydroxylamine) and methanol in supercritical $CO_2$ is added to the vessel to 3,000 psi at 75° C. The mixture composition by weight is 70:30, and the total concentration of the adjunct added is 5%. The fluid mixture is circulated through the vessel for 40 seconds. A second cleaning solution consisting of a Lewis base (thiophene) and HF displaces the first cleaning solution. The mixture composition by weight is 93:7, and the total concentration of the adjunct added is 2% of the overall weight. The second solvent mixture is in contact with the substrate for 15 seconds. The system is then rinsed with pure supercritical $CO_2$. A final flush with liquid $CO_2$ and $CO_2$-philic a surfactant such as perfluorooctanoic acid is performed to remove particles prior to a pure $CO_2$ flush.

The system is depressurized and the substrate removed.

The foregoing is illustrative of the present invention, and is not to be construed as limiting thereof. The invention is defined by the following claims, with equivalents of the claims to be included therein.

Which is claimed is:

1. A method of cleaning a microelectronic substrate, comprising:
    (a) providing a first cleaning fluid, said first cleaning fluid consisting of a single phase solution of an amine and a polar organic cosolvent in carbon dioxide;
    (b) providing a second cleaning fluid, said second cleaning fluid consisting of an adduct of hydrogen fluoride with a Lewis base in carbon dioxide;
    (c) cleaning said substrate by contacting said substrate to said second cleaning fluid for a time sufficient to clean said substrate; and
    (d) cleaning said substrate before, after, or both before and after said cleaning step (c) by contacting said substrate to said first cleaning fluid for a time sufficient to clean said substrate.

2. The method according to claim 1, wherein said amine is morpholine, aniline or dibutylamine.

3. The method according to claim 1, wherein said polar organic cosolvent is a C1–C4 alcohol.

4. The method according to claim 1, wherein said Lewis base is pyridine or poly(vinylpyridine) or triethylamine.

5. The method according to claim 1, wherein said second cleaning fluid comprises:
    from 0.001 to 20 percent by weight of said adduct of hydrogen fluoride with a Lewis base; and
    from 50 to 99.999 percent by weight of carbon dioxide.

6. The method according to claim 1, wherein said first cleaning fluid is nonaqueous.

7. The method according to claim 1, wherein said carbon dioxide is liquid carbon dioxide.

8. The method according to claim 1, wherein said carbon dioxide is supercritical carbon dioxide.

* * * * *